United States Patent [19]

Weinstein et al.

[11] Patent Number: 4,973,937

[45] Date of Patent: Nov. 27, 1990

[54] ELECTRICAL SHUNT APPARATUS

[76] Inventors: Barnet Weinstein, 14 Robert Rd., Marblehead, Mass. 01945; Ralph A. Naylor, 132 Pillsbury Rd., Londonderry, N.H. 03053

[21] Appl. No.: 340,514

[22] Filed: Apr. 19, 1989

Related U.S. Application Data

[63] Continuation of Ser. No. 322,541, Mar. 13, 1989.

[51] Int. Cl.$^5$ .................................................. H01C 7/00
[52] U.S. Cl. ...................................... 338/49; 324/126; 29/621; 361/58
[58] Field of Search ...................... 338/49, 61; 361/58; 29/621, 845, 854; 324/126; 439/507, 508, 510, 511, 512

[56] References Cited

U.S. PATENT DOCUMENTS

| | | | |
|---|---|---|---|
| 496,501 | 5/1893 | Weston | 338/49 |
| 2,640,092 | 5/1953 | Fett et al. | 338/49 |
| 3,252,091 | 5/1966 | Morgan | 338/49 X |
| 4,001,684 | 1/1977 | Fritts | 324/126 |
| 4,178,618 | 12/1979 | Khalid | 338/61 X |
| 4,480,222 | 10/1984 | Dudley et al. | 324/126 |
| 4,629,979 | 12/1986 | Missout et al. | 324/126 |
| 4,726,787 | 2/1988 | Stine | 439/510 |

*Primary Examiner*—George H. Miller, Jr.
*Assistant Examiner*—Marvin M. Lateef
*Attorney, Agent, or Firm*—Wolf, Greenfield & Sacks

[57] ABSTRACT

A multipurpose electrical shunt, formed from an integral body of material, includes a first and second electrical connectors spaced apart for mating with a first terminal of a main circuit breaker and a first terminal of a branch circuit breaker. The shunt further includes an electrically resistive material integrally connected to the first and second electrical connectors for providing a voltage drop thereacross proportional to the current flowing therethrough and first and second output terminals extending beyond the resistive material for connection to a current sensing means such as an electrical meter. The shunt provides a current carrying conductor connecting a main circuit breaker to the branch circuit breaker and further provides sensing of the current flow between the main circuit breaker and the branch circuit breaker.

15 Claims, 2 Drawing Sheets

ELECTRICAL SHUNT APPARATUS

RELATED APPLICATIONS

This application is a continuation of U.S. patent application Ser. No. 322,541 filed on Mar. 13, 1989.

FIELD OF THE INVENTION

The present invention relates to the field of electrical circuitry, and more specifically, to an apparatus for sensing current flow between two points in an electrical power distribution circuit. In particular, the apparatus of the present invention provides an electrical shunt formed from an integral body of material and functioning to provide a current carrying conductor connecting a main circuit breaker to at least one branch circuit breaker and to further provide a sensing of the current flow between the main circuit breaker and the branch circuit breaker.

BACKGROUND OF THE INVENTION

An electrical shunt is a device displaying electrically resistive properties and is typically used to sense the flow of electrical current between the two points in an electrical circuit. Typically, the shunt is connected in parallel across another device, such as a direct current ammeter, to divert most of the current from the device.

The shunt enables measurement of current between two points by providing a known resistance over which a voltage drop develops in proportion to the current flowing therethrough. The voltage drop across the shunt is then connected to the inputs of a meter which provides a current reading proportional to the amount of current flowing through the shunt. One such application is shown by the known prior art circuit configuration 100 of FIG. 1.

FIG. 1 is a perspective, cut away view of a prior art shunt implementation, typically used with power distribution control panels for marine vehicles such as power boats and sail boats, as well as land vehicles, such as trucks and trailers. As shown in FIG. 1, a main circuit breaker 10 is connected to a plurality of branch circuit breakers 12, 14 and 16 by shunt 20. Branch circuit breakers 12, 14 and 16 are connected to a common power bus node 18. The ends of electrical shunt 20 are connected to main circuit breaker 10 and the power bus 18 by heavy gauge insulated power conducting wires 24 and 22, respectively. Two mounting screws or studs 28 and 30 secure shunt 20 to an insulating mounting base 26, away from the power source or other electrical parts which may cause a short circuit of the shunt. Shunt 20 is connected to meter 36 by small gauge signal wires 32 and 34 which are soldered to shunt 20 at one end and have quarter-inch quick connect terminals fastened to their other ends for connecting to the meter.

The large number of parts, and the increased possibility of failure, accompanying such a large number of parts are disadvantages of the shunt implementation of FIG. 1. Furthermore, because of the large number of parts, the shunt may not be installed rapidly enough to be as cost effective as desired.

SUMMARY OF THE INVENTION

It is an object of the present invention to provide an electrical shunt which has high reliability due to its one piece construction and lack of extraneous joints Another object of the present invention is to provide an electrical shunt which reduces the risk of electrical fires caused by loose connectors coupling the shunt to the other circuit elements.

A further object of the present invention is to provide an electrical shunt which can be implemented into a power distribution circuit using a minimized number of parts and with reduced installation time in comparison with prior art implementations.

Yet another object of the present invention to to provide an electrical shunt which has low manufacturing costs over those of prior art shunts.

Still another object of the present invention is to provide efficient methods of providing a current carrying conductor to sense and distribute current flow between a main circuit breaker and at least one branch circuit breaker.

The foregoing and other objects of the present invention are achieved with an improved electrical shunt which connects directly to the main circuit breaker and branch circuit breaker in a circuit for providing a current carrying conductor therebetween and a current sensing element having a defined electrical resistance for providing a voltage drop thereacross.

According to the invention, a multipurpose electrical shunt is formed from an integral body of material and functions to provide a current carrying conductor connecting a main circuit breaker to at least one branch circuit breaker and to further provide sensing of current flow between the main breaker and the branch breaker. The shunt body comprises integral mounting means for connection to the main circuit breaker and the branch circuit breaker and resistive means connected to the mounting means for producing a voltage drop thereacross proportional to the current flowing therethrough. The shunt body further comprises terminal means connected to the resistive means for connection to an electrical meter or circuit input.

According to the invention, a multipurpose electrical shunt is formed from an integral body of material and comprises a first and second electrical connecting means which are spaced apart for mating with a first terminal of the main circuit breaker and a first terminal of the branch circuit breaker. The shunt further comprises an electrically resistive means integrally connected to the first and second connecting means for providing a voltage drop thereacross proportional to the electrical current flowing therethrough. The shunt further comprises first and second output terminals connected to the resistive means and extending therebeyond for connection to a current sensing means, such as electrical meter or circuit input.

According to the invention, a method of distributing electrical power from a main circuit breaker to at least one branch circuit breaker comprises mechanically and electrically coupling an electrical shunt, having a unitary body, between a first terminal of a main circuit breaker and a first terminal of a branch circuit breaker, the shunt having integral output terminals for attachment to the terminals of a sensing element. Accordingly, no extraneous wire connectors are required to obtain a current flow through the shunt, the current flow being measurable by the sensing element in accordance with the voltage drop present at the integral output terminals of the shunt.

The invention will be more fully understood from the detailed description set forth below, which should be read in conjunction with the accompanying drawings.

DETAILED DESCRIPTION OF THE INVENTION

Figure 2:
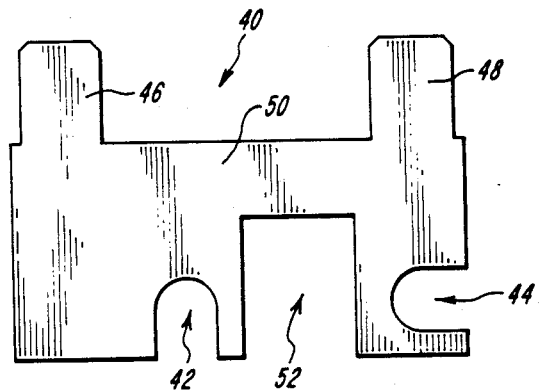
FIG. 2 is a side view of the multipurpose electrical shunt of the present invention.

Referring to the drawings, and in particular FIG. 2, the improved electrical shunt 40 of the present invention is shown. Shunt 40 is comprised of electrical connectors 42 and 44 acting as connecting or mounting means, output terminals 46 and 48, and an integral electrically resistive element 50 acting as resistive means. Preferably, shunt 40 has a unitary body in which resistive element 50, electrical connectors 42 and 44, and output terminals 46 and 48 are integrally formed of the same material cut or stamped from a sheet of material having the required resistivity.

In the preferred embodiment, the unitary body of shunt 40 is formed from a uniform sheet of material comprised of an electrically conductive metal alloy having good tensile strength. Such a material is commercially available under the trade name of Manganin from Harrison Alloys, Inc., Harrison, NJ 07029. Manganin is a copper-nickel alloy being comprised of approximately 10% manganese, 4.5% nickel, and 85.5% copper. The specific resistance of Manganin is approximately 229 ohms per circular mil foot at 20° C. The density of Manganin is approximately 0.303 lbs. per cubic inch and the tensile strength of the annealed metal is 276 Newtons per millimeter squared.

Since current sensing with a shunt involves measuring the voltage drop across a known resistance it is important that the resistance of the shunt be constant under different temperature conditions. Particularly in power distribution control panel implementations, the range of temperatures involved is high since heating of the shunt will occur due to the heavy current involved and because the ambient temperature behind the the control panel is higher than room temperature. Typically, the shunt will reach a maximum temperature of approximately 80° C. with the usual range being between 40°-60° C. Manganin has its maximum resistance at approximately 50° C. and has a temperature coefficient of resistance of +/−0.000015 between 40°-60° C.

Since shunt 40 is comprised of a homogenous material having a specific resistance, resistive element 50 comprises most of the shunt body, except for output terminals 46 and 48, as shown in FIG. 2. The size of notch 52 controls the actual resistance of shunt 40. As the size of notch 52 decreases, there is a corresponding increase in the amount of current conducting material within the shunt body and a corresponding decrease in the overall resistance of the shunt.

Shunt 40 further comprises electrical connectors 42 and 44 integrally formed from resistive element 50. Electrical connectors 42 and 44 consist of slots in resistive element 50 which have a semi circular profile which is adapted to accept the neck of the mounting screws at the appropriate circuit breaker terminals. Electrical connectors 42 and 44 are oriented at right angles to each other to minimize the risk of accidental dislocation of the shunt during installation into the power distribution circuit.

A pair of output terminals 46 and 48 project outwardly from resistive element 50 to facilitate measurement of the voltage drop across shunt 40. In the preferred embodiment, output terminals 46 and 48 are quarter inch male quick connect terminals which are adapted to accept conventional quarter-inch female quick connect terminals.

Figure 1:
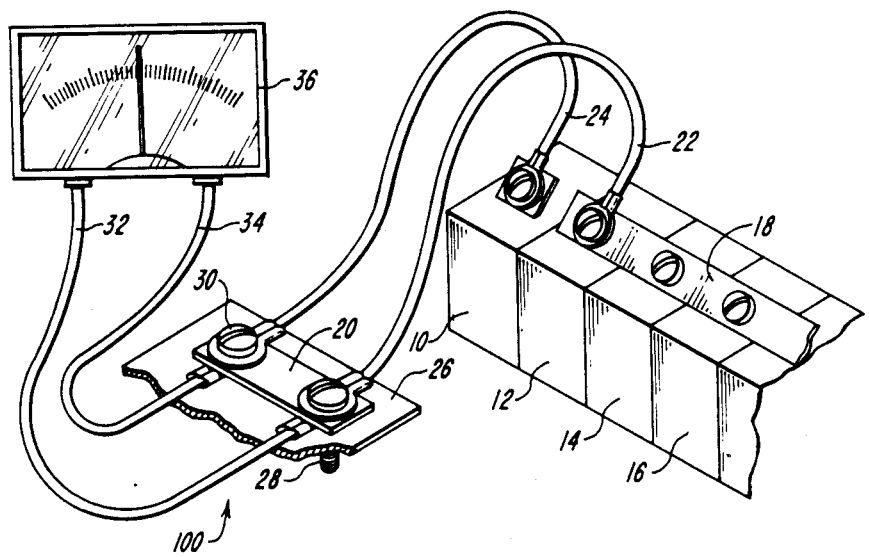
FIG. 1 is a perspective, cutaway view of a typical prior art shunt, including the wiring scheme necessary for implementation.
Figure 3:
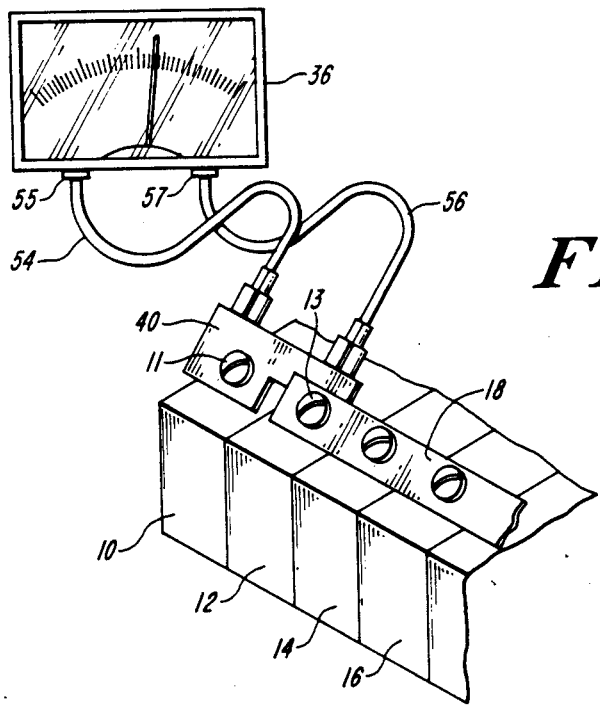
FIG. 3 is a perspective, cutaway view of the electrical shunt of the present invention, illustrating the electrical connections for implementation.
Figure 4:
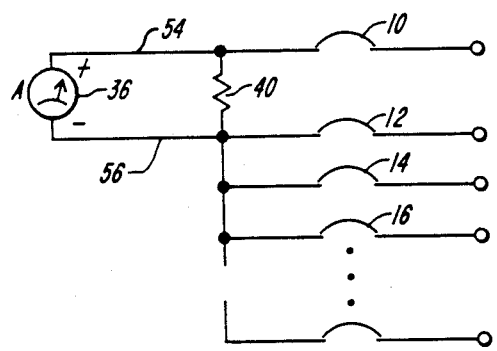
FIG. 4 is an electrical schematic diagram of the shunt implementation of FIG. 3.

The preferred implementation of shunt 40, as part of a power distribution circuit, is shown mechanically in FIG. 3 and schematically in FIG. 4. As shown in FIG. 3, electrical connector 42 of shunt 40 is mechanically and electrically connected to a first terminal of main circuit breaker 10 by screw fastener 11 while electrical connector 44 is mechanically and electrically coupled to the first terminal of the branch circuit breaker 12 by screw fastener 13 and electrically coupled with power bus 18. A pair of small gauge signal wires, 54 and 56, having conventional quarter-inch female quick connect terminals fastened to each end are mated with output terminals 46 and 48 respectively, and to the male quick connect terminals 55 and 57 of meter 36.

As shown in FIG. 4, shunt 40 provides an electrical connection between a first terminal of main circuit breaker 10 and branch circuit breakers 12, 14 and 16. A direct current power source is connected to a second terminal of main circuit breaker 10. Shunt 40 therefore electrically couples the source of power, via main circuit breaker 10, to the system load, via the branch circuit breakers 12, 14 and 16. Shunt 40 further enables measurement of the load current flowing from the main circuit breaker 10 to the branch circuit breakers 12, 14 and 16 by developing a voltage drop thereacross which is directly proportional to the load current flowing therethrough. In the preferred embodiment, the improved shunt of the present invention will develop a 1 millivolt drop across itself for every ampere of current flowing through the shunt. Shunt 40 is rated as a 50 amp shunt, meaning it can conduct up to 50 amps of current therethrough while developing the required 50 mV thereacross. When the voltage output measured across output terminals 46 and 48 is supplied to the input terminals of a millivolt meter, the meter reading will correspond to the current flowing through shunt 40.

Figure 5:
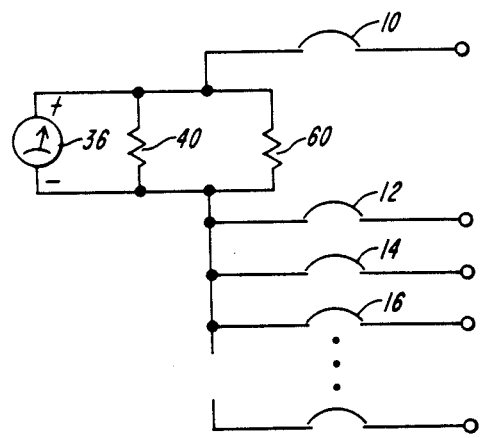
FIG. 5 is an electrical schematic diagram of an alternate implementation of present invention in which two identical shunts are connected in parallel between the main circuit breaker and the branch circuit breakers.

In an alternate implementation, two identical electrical shunts 40 and 60 are connected in parallel between main circuit breaker 10 and branch circuit breakers 12-16, as shown by the schematic diagram of FIG. 5. In this implementation, shunts 40 and 60 are both connected to a terminal of main circuit breaker 10 and branch circuit breaker 12, and are separated by a space or suitable insulating material. If both shunts are identical in shape, size, and composition the output terminals of only one of the shunts needs to be supplied to meter 36. The meter scale need only to be recalibrated so that a full scale deflection indicates double the current through one shunt. This technique of connecting identical shunts in parallel may be extended to any number of identical shunts which will collectively have an aggregate shunt value rating.

In light of the above discussion, it can be seen that due to the unitary body of shunt 40, the shunt may be manufactured for considerably reduced costs. Further, since there are no joints to fail in the shunt itself, and no connecting jumpers required, there is less chance of joint failure and electrical fires caused by loose power connections. Hence, the shunt itself and the circuit implementation are more reliable and safer. In addition, the shunt of the present invention is more economical due to the reduction in parts and installation time necessary to implement the shunt into a power distribution circuit. Finally, the shunt itself may be used as a building block which can be used in conjunction with other identical shunts to achieve an aggregate shunt value.

Having thus described one particular embodiment, various alterations, modifications and improvements will readily occur to those skilled in the art. For example, the shunt of the preferred embodiment is stamped from a uniform sheet of material but could be formed from varying thickness sheets in various shapes. The terminals and connector ends can vary in configuration and form to use screws, quick connect terminals or other means of connection and attachment. Such alterations, modifications, and improvements as are made obvious by this disclosure are intended to be part of this disclosure though not expressly stated herein, and are intended to be in the spirit and scope of the invention. Accordingly, the foregoing description is intended to be exemplary only and not limiting. The invention is limited only as defined in the following claims ad the equivalents thereto.

What is claimed:

1. A multipurpose electrical shunt formed from an integral body of resistive material and functioning to provide a current carrying conductor in sheet form connecting a main circuit breaker to at least one branch circuit breaker and to further provide sensing of current flow between the main circuit breaker and the branch circuit breaker, said shunt comprising:

said body beginning shaped to have integral means for connection to said main circuit breaker and said branch circuit breaker;

said body further comprising resistive means connected to said mounting means for producing a voltage drop thereacross proportional to the current flowing therethrough; and terminal means connected to said resistive means for connection to an electrical meter or circuit input.

2. In an electrical circuit in which a main circuit breaker is connected to a first end of an electrical shunt by a first current carrying wire and a second end of said electrical shunt is connected to at least one branch circuit breaker by a second current carrying wire, the improvement comprising:

an improved shunt connected directly to said main circuit breaker and said branch circuit breaker for providing a current carrying conductor therebetween and a current sensing element having defined electrical resistance for providing a voltage drop there across, said shunt comprising:

first and second electrical connecting means which are spaced apart for mating with a first terminal of said main circuit breaker and a first terminal of said branch circuit breaker respectively;

a resistive means integrally connected to said first connecting means and said second connecting means for providing a voltage drop thereacross proportional to the electrical current flowing therethrough;

a first and second output terminal connected to said resistive means and extending therebeyond for connection to a current measuring means.

3. The improved shunt of claim 2 wherein said shunt has a unitary body in which said resistive means, said first and second electrical connecting means, and said first and second output terminals are integrally formed.

4. The improved shunt of claim 3 wherein said shunt is comprised of an electrically conductive material having a resistivity of between 150 ohms per square mil. foot and 250 ohms per square mil foot at 20° C. and is in the form of a sheet.

5. The improved shunt of claim 4 wherein said shunt is comprised of material having a tensile strength of between 250 N/mm$^2$ and 300 N/mm$^2$ at 20° C.

6. The improved shunt of claim 4 wherein said shunt is capable of permitting current flow therethrough from between 0.001 amps to 100. amps and said first and second electrical connecting means, said resistive means and, said first and second output terminals are formed by cut out portions of said sheet.

7. The improved shunt of claim 4 wherein said resistive means has a temperature coefficient of resistance of +/− 0.000015 between 40°-60° C.

8. The improved shunt of claim 2 wherein said current measuring means comprises a direct measuring meter.

9. The improved shunt of claim 2 wherein said second electrical connecting means of said improved shunt is electrically coupled in common to a first terminal of at least two of said branch circuit breakers.

10. The improved shunt of claim 2 wherein said electrical circuit is part of a power distribution circuit for a land or marine vehicle.

11. The improved shunt of claim 2 wherein a plurality of improved shunts are electrically coupled in parallel to said main circuit breaker and said branch circuit breaker, said shunts being separated by an insulator.

12. In a method of distributing electrical power from a main circuit breaker to at least one branch circuit breaker the improvement comprising:

mechanically and electrically coupling an electrical shunt having a unitary body between a first terminal of said main circuit breaker and a first terminal of said branch circuit breaker, said shunt having integral output terminals for attachment to the terminals of a sensing element, whereby no extraneous wire connectors are required to obtain a current flow through said shunt, said current flow being measurable by said sensing element in accordance with the voltage drop present at said integral output terminals.

13. In a method of measuring current flow between a first terminal of a main circuit breaker and a first terminal of a branch circuit breaker, including the steps of electrically coupling an electrical shunt having a known resistance to said main circuit breaker first terminal and said branch circuit breaker first terminal and measuring the voltage drop across said shunt with a measuring means, the improvement comprising the step of:

mechanically coupling said electrical shunt directly to said main circuit breaker first terminal and said branch circuit breaker first terminal, whereby no extraneous wire connectors are required to obtain a current flow through said shunt.

14. In an electrical power distribution circuit for a land or marine vehicle in which a main circuit breaker is connected to a first end of an electrical shunt by a first current carrying wire and a second end of said electrical shunt is connected in common to at least two branch circuit breakers by a second current carrying wire the improvement comprising:

an improved shunt connected directly to said main circuit breaker and said branch circuit breaker for providing a current carrying conductor therebetween and a current sensing element having defined electrical resistance for providing a voltage drop thereacross, said shunt comprising:

first and second electrical connecting means which are spaced apart for mating with a first terminal of said main circuit breaker and a first terminal of said branch circuit breaker respectively;

a resistive means integrally connected to said first connecting means and said second connecting means for providing a voltage drop thereacross proportional to the electrical current flowing therethrough;

a first and second output terminal connected to said resistive means and extending therebeyond for connection to an electrical meter;

said shunt having a unitary body in which said resistive means, said first and second electrical connecting means, and said first and second output terminals are integrally formed, said shunt being comprised of an electrically conductive metal having a resistivity of between 150 ohms per square mil ft. and 250 ohms per square mil ft. at 20° C. and is in the form of a sheet, said shunt being comprised of a metal having a tensile strength of between 250 N/mm$^2$ and 300 N/mm$^2$ at 20° C., said resistive means having a temperature coefficient of resistance of $+/-$ 0.000015 between 40°-60° C., said shunt being capable of permitting current flow therethrough from between 0.001 amps to 100. amps, said first and second electrical connecting means, said resistive means, and said first and second output terminals are formed by cut out portions of said sheet.

* * * * *